(12) United States Patent
Takai

(10) Patent No.: US 10,012,896 B2
(45) Date of Patent: Jul. 3, 2018

(54) LITHOGRAPHY MASK PRODUCTION METHOD AND LITHOGRAPHY MASK PRODUCTION SYSTEM

(71) Applicant: TOSHIBA MEMORY CORPORATION, Tokyo (JP)

(72) Inventor: Kosuke Takai, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 32 days.

(21) Appl. No.: 15/253,510

(22) Filed: Aug. 31, 2016

(65) Prior Publication Data
US 2017/0269469 A1    Sep. 21, 2017

(30) Foreign Application Priority Data
Mar. 15, 2016  (JP) .................................. 2016-051698

(51) Int. Cl.
*G03F 1/24*    (2012.01)
*G03F 1/44*    (2012.01)

(52) U.S. Cl.
CPC . *G03F 1/24* (2013.01); *G03F 1/44* (2013.01)

(58) Field of Classification Search
CPC ..................................... G03F 1/24; G03F 1/44
USPC ........................................................ 430/5, 30
See application file for complete search history.

(56) References Cited

U.S. PATENT DOCUMENTS

2017/0038671 A1    2/2017  Takai

FOREIGN PATENT DOCUMENTS

| JP | 2006-091670 A | 4/2006 |
| JP | 5187060 B2 | 4/2013 |
| JP | 2014-090132 | 5/2014 |

*Primary Examiner* — Christopher G Young
(74) *Attorney, Agent, or Firm* — Patterson & Sheridan, LLP

(57) ABSTRACT

A lithography mask production method includes (a) forming, in a reflection layer of a blank substrate, a reference pattern used as a reference in reflectivity measurement and a reflection pattern used for lithography; (b) measuring a reflectivity Rref of the reflection layer at the reference pattern and a reflectivity RLS of the reflection layer at the reflection pattern; and (c) determining an effective width of the reflection layer at the reflection pattern based on the reflectivity Rref and the reflectivity RLS.

11 Claims, 14 Drawing Sheets

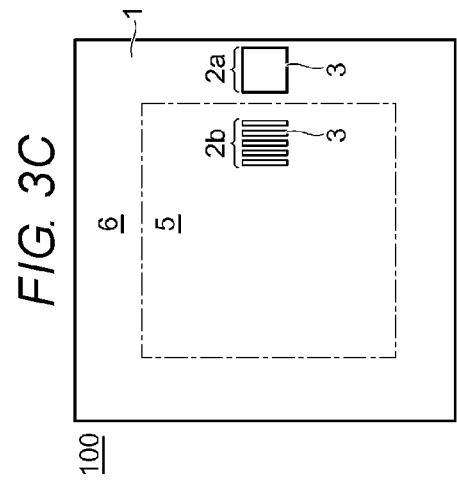
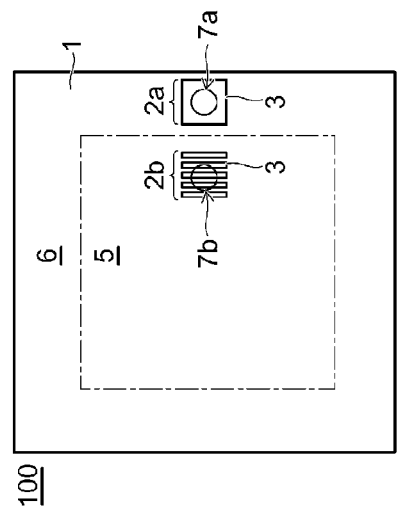
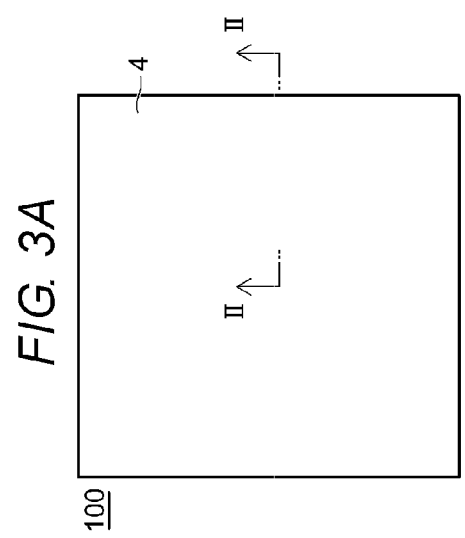
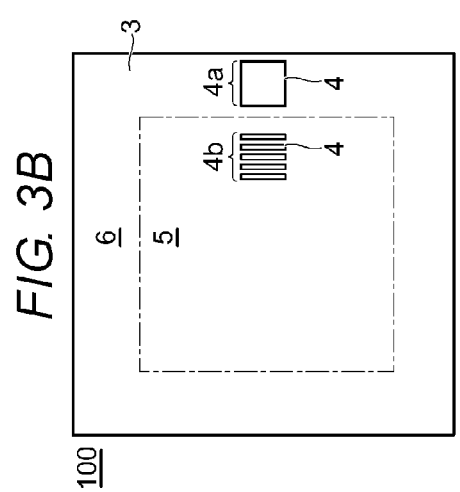

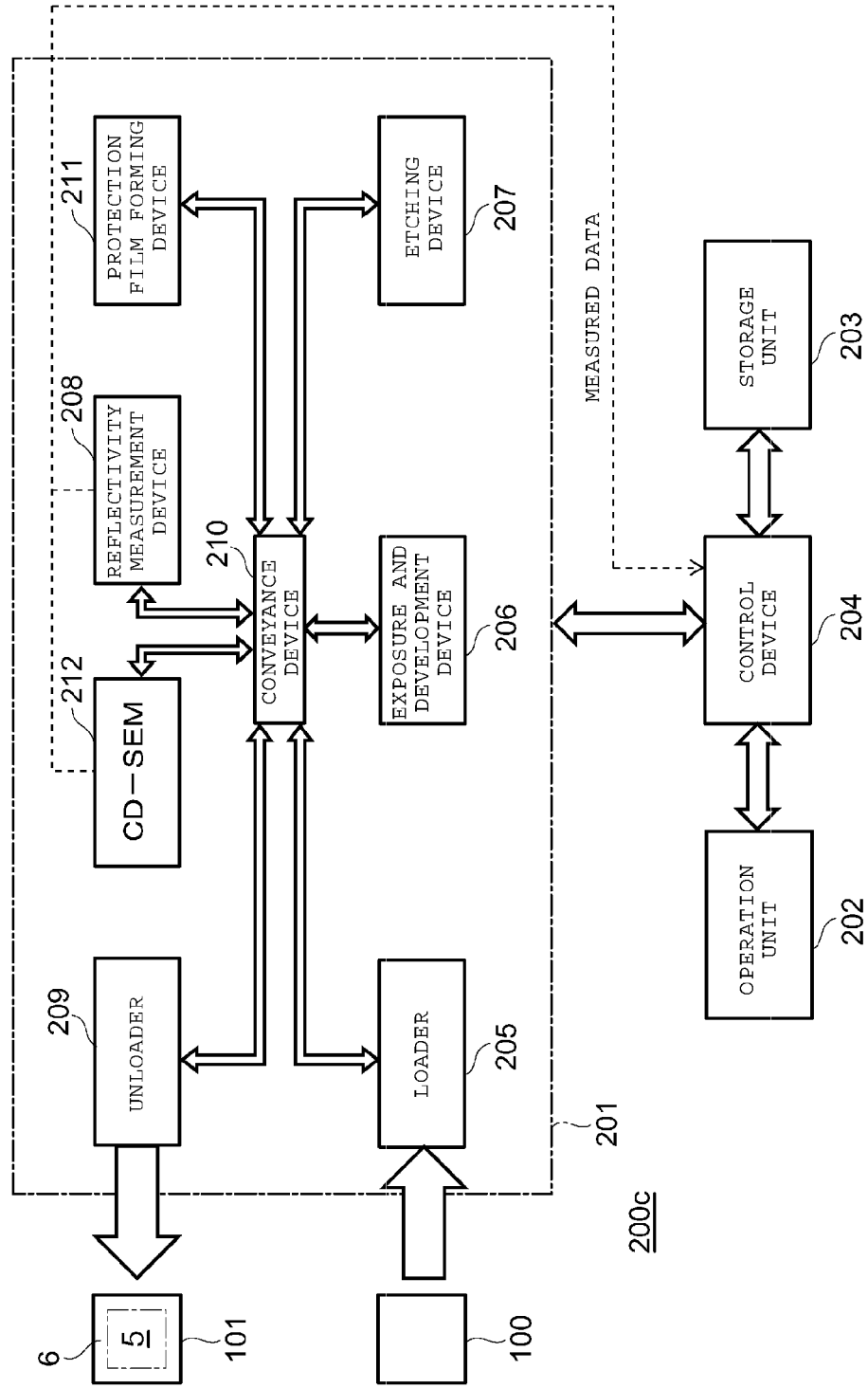

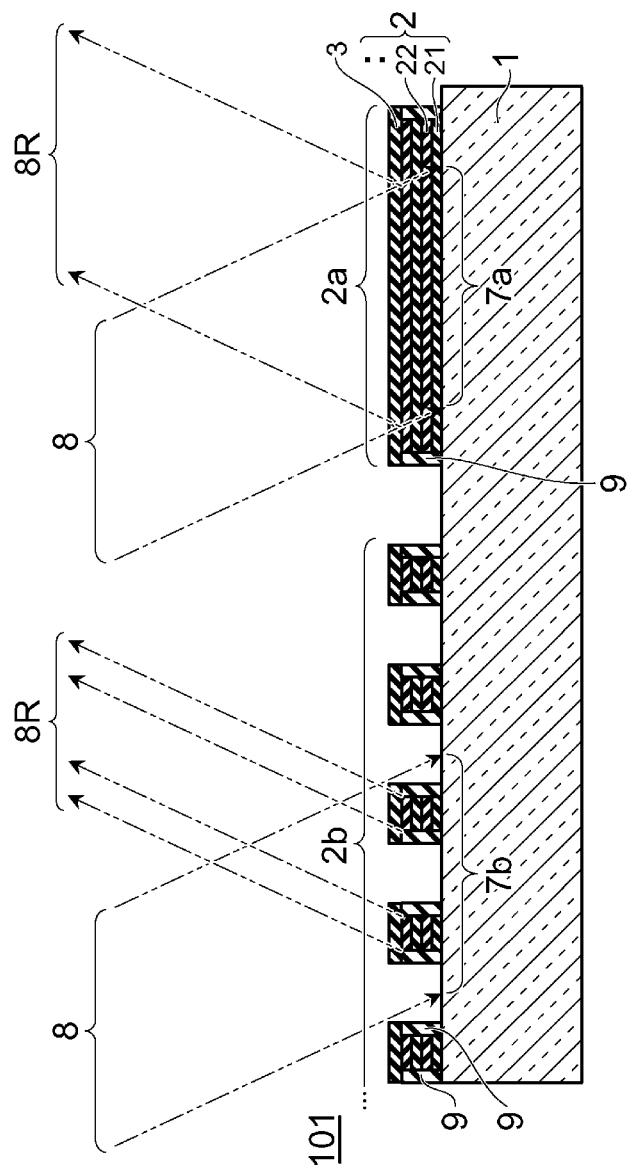

LITHOGRAPHY MASK PRODUCTION METHOD AND LITHOGRAPHY MASK PRODUCTION SYSTEM

CROSS-REFERENCE TO RELATED APPLICATION

This application is based upon and claims the benefit of priority from Japanese Patent Application No. 2016-051698, filed Mar. 15, 2016, the entire contents of which are incorporated herein by reference.

FIELD

Embodiments described herein relate generally to a lithography mask production method and a lithography mask production system.

BACKGROUND

Generally, miniaturization of semiconductor devices is advancing. A shorter wavelength of light used for lithography contributes to the miniaturization. For example, extreme ultraviolet (EUV: wavelength of 13.5 nm) is known as light used for short wavelength lithography. A reflection type mask is used in EUV lithography. In the reflection type mask, an absorption layer is formed on a reflection layer. When the absorption layer is thick, a shadowing phenomenon occurs during exposure. A reflection layer processed-type mask formed by removing a reflection layer is suggested in order to suppress the shadowing phenomenon. Side walls of the reflection layer are exposed to the outside air in the reflection layer processed-type mask. Therefore, there is a possibility that the reflection layer is oxidized in atmosphere or dissolved by chemicals during cleaning. Coating the side walls of the reflection layer, for example, with a protection film, is effective. However, when the side walls of the reflection layer are coated with the protection film, an effective width of the reflection layer is difficult to measure.

DESCRIPTION OF THE DRAWINGS

FIG. 3A to FIG. 3D are schematic plan views illustrating an example of the lithography mask production method according to the first embodiment.

FIG. 13 is a schematic block diagram illustrating a third example of the lithography mask production system.

FIG. 14 is a schematic sectional view illustrating an example of reflectivity measurement according to a fourth embodiment.

DETAILED DESCRIPTION

Figure 1:
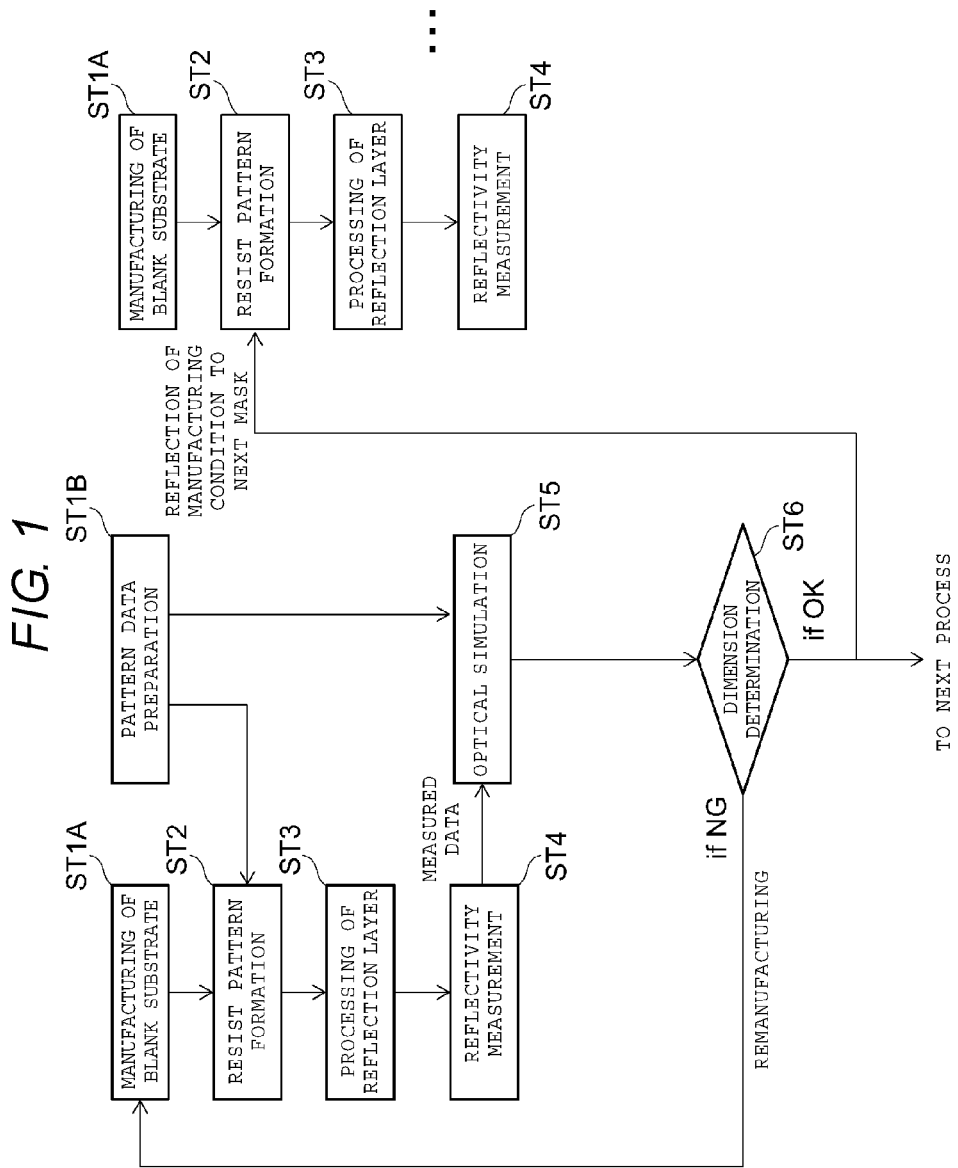
FIG. 1 is a flowchart illustrating an example of a lithography mask production method according to a first embodiment.

Embodiments provide a lithography mask production method and a lithography mask production system capable of measuring an effective width of a reflection layer even when side walls of the reflection layer are coated with a protection film.

In general, according to an embodiment, there is provided a lithography mask production method that includes (a) forming, in a reflection layer of a blank substrate, a reference pattern used as a reference in reflectivity measurement and a reflection pattern used for lithography; (b) measuring a reflectivity Rref of the reflection layer at the reference pattern and a reflectivity RLS of the reflection layer at the reflection pattern; and (c) determining an effective width of the reflection layer at the reflection pattern based on the reflectivity Rref and the reflectivity RLS.

Hereinafter, certain embodiments will be described with reference to the accompanying drawings. In respective figures, the same constitutional elements are denoted by the same reference numerals. The embodiment illustrates a reflection layer processed-type mask used in EUV (wavelength in the vicinity of 13.5 nm) exposure as a lithography mask.

First Embodiment

Production Method

FIG. 1 is a flowchart illustrating an example of a lithography mask production method according to a first embodiment. FIG. 2A to FIG. 2G are schematic sectional views illustrating an example of the lithography mask production method according to the first embodiment. FIG. 3A to FIG. 3D are schematic plan views illustrating an example of the lithography mask production method according to the first embodiment. The cross sections illustrated in FIG. 2A to FIG. 2G correspond to those taken along line II-II in FIG. 3A.

1. Manufacturing of Blank Substrate and Arrangement of Pattern Data

As indicated in Step ST1A in FIG. 1, a blank substrate is manufactured and arranged. The blank substrate is made of lithography mask material. A schematic cross section and a schematic plan view of a blank substrate 100 are illustrated in FIG. 2A and FIG. 3A, respectively.

Figure 2A:
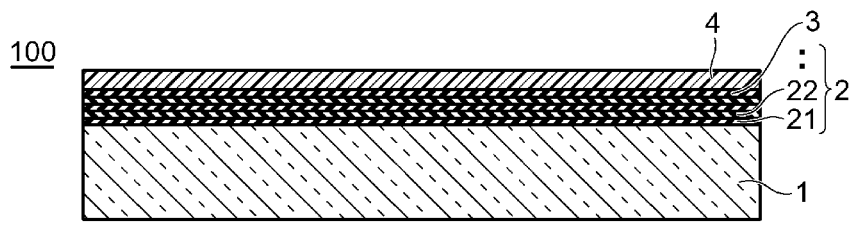
FIG. 2A to FIG. 2G are schematic sectional views illustrating an example of the lithography mask production method according to the first embodiment.

As illustrated in FIG. 2A and FIG. 3A, the blank substrate 100 includes a reflection layer 2, a capping layer 3, and a resist layer 4 on a glass substrate 1. A low thermal expansion glass substrate is used for the glass substrate 1. The reflection layer 2 is a multilayer film. The multilayer film includes, for example, a silicon layer 21 and a molybdenum layer 22 which are alternately stacked. The number of stacked layers of the silicon layer 21 and the molybdenum layer 22 is, for example, 40 pairs or more. The capping layer 3 is provided on the reflection layer 2. The capping layer 3 contains, for example, ruthenium or silicon. The resist layer 4 is provided on the capping layer 3. The resist layer 4 is, for example, an electron beam resist. The resist layer 4 is used as, for example, an etching mask when the reflection layer 2 is processed.

Apart from the blank substrate 1, pattern data is prepared and arranged as illustrated in Step ST1B in FIG. 1. The pattern data includes information defining a pattern to be formed in the reflection layer 2. A resist pattern is formed in the resist layer 4 by an electron beam rendering device based on the pattern data. The information included in the pattern data is used for control of electron beam scanning during rendering.

2. Formation of Resist Pattern

Figure 2B:
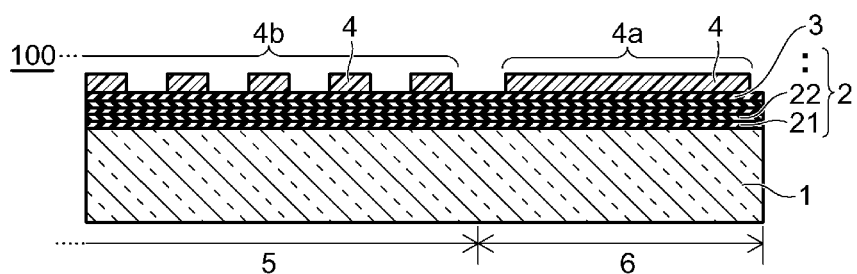

As illustrated in Step ST2 in FIG. 1, the pattern to be formed on the reflection layer 2 is rendered into the resist layer 4 (exposure is performed) using, for example, the electron beam rendering device. Next, the resist layer 4 is subjected to development to form the pattern. With this, as illustrated in FIG. 2B and FIG. 3B, the resist pattern is formed on the capping layer 3. The resist pattern formed includes a resist pattern 4a and a resist pattern 4b. In the blank substrate 100, a pattern region 5 on which a reflection pattern used for lithography is formed and a peripheral region 6 are set. The pattern region 5 is set in a central portion of the blank substrate 100. The peripheral region 6 is defined, for example, in a frame shape outside the pattern region 5.

The resist pattern 4a corresponds to a pattern used as a reference in the reflectivity measurement. The resist pattern 4a is formed as, for example, a pattern only for the resist layer 4. The resist pattern 4a is formed in the peripheral region 6.

The resist pattern 4b corresponds to a reflection pattern used for lithography. The reflection pattern corresponds to, for example, an element formation pattern, a wiring formation pattern, an opening formation pattern, or the like in an integrated circuit. The resist pattern 4b may be a periodic pattern in which the resist layer 4 and a portion where the resist layer 4 is removed are periodically included like an L/S (line & space) pattern, for example. The resist pattern 4b is formed on the pattern region 5.

3. Processing of Reflection Layer

Figure 2C:
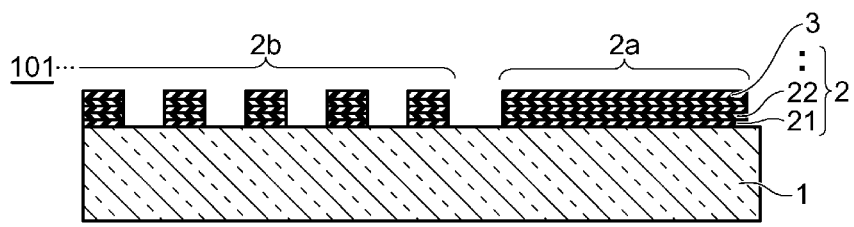

As illustrated in Step ST3 in FIG. 1, the capping layer 3 and the reflection layer 2 are etched using the resist patterns 4a and 4b as a mask for etching. The resist patterns 4a and 4b are transferred to the capping layer 3 and the reflection layer 2 by etching as illustrated in FIG. 2C and FIG. 3C. After the capping layer 3 and the reflection layer 2 are etched, the resist patterns 4a and 4b are subjected to ashing and are removed.

With this, the reflection layer 2 is processed to include a reference pattern 2a of which an upper portion is provided with the capping layer 3 and a reflection pattern 2b. In the embodiment, the reference pattern 2a includes, for example, a rectangular reflection layer 2 of 2 mm×2 mm. The reflection pattern 2b includes an L/S pattern which is periodically provided in a rectangular region of 2 mm×2 mm, for example. With this, a lithography mask 101 is completed.

4. Reflectivity Measurement

Figure 2D:
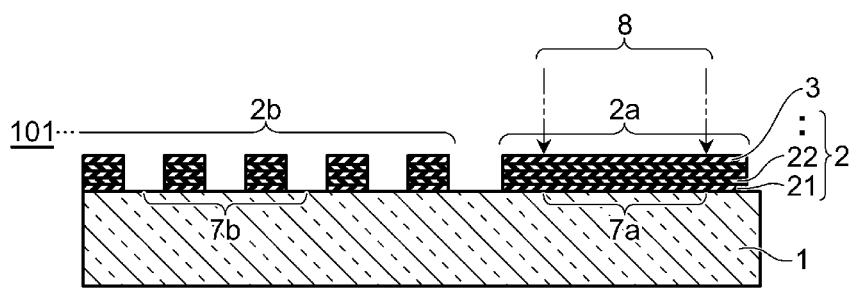
Figure 2E:
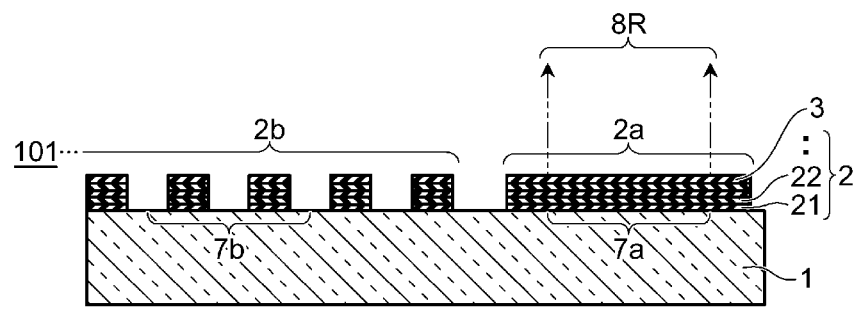
Figure 2F:
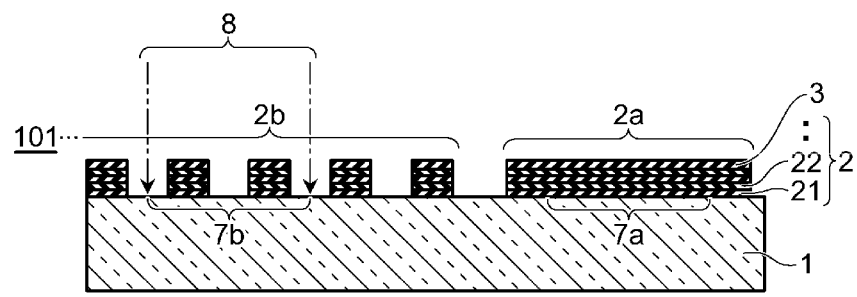

As illustrated in Step ST4 in FIG. 1, a reflectivity Rref of the reference pattern 2a and a reflectivity RLS of the reflection pattern 2b are measured using a reflectometer. The reflectometer is, for example, an EUV reflectometer. The EUV reflectometer irradiates measurement spots 7a and 7b with EUV light 8 as measurement light as illustrated in FIG. 2D and FIG. 2F. A wavelength of the EUV light 8 is, for example, 13.5 nm (in the present disclosure, the wavelength of 13.5 nm is regarded as including 13.5 nm and a wavelength in the vicinity of 13.5 nm. The wavelength may be, for example, roughly 13.5 nm). It should be noted that EUV is generally regarded as referring to light having a wavelength from about 10 nm to about 100 nm, and the embodiments described herein are all equally applicable to processing using any wavelength in the EUV range.

The reflectometer may have a simple configuration. Measurement light is EUV light 8, but plane sizes of the measurement spots 7a and 7b are relatively large, for example 1.5 mmφ. The plane sizes of the measurement spots 7a and 7b are defined to be smaller than those of the reference pattern 2a and the reflection pattern 2b as illustrated in FIG. 3D. Thus, the measurement spots 7a and 7b include only the pattern required for the measurement. The plane size of the measurement spot 7a is, for example, equal to the plane size of the measurement spot 7b. This way, accuracy of optical simulation to be performed later can be higher than a case where the plane size of the measurement spot 7a differs from the plane size of the measurement spot 7b.

The reflectivity is measured in each of the reference pattern 2a and the reflection pattern 2b. For example, as illustrated in FIG. 2D, the measurement spot 7a on the reference pattern 2a is irradiated with EUV light 8 as measurement light. As illustrated in FIG. 2E, EUV light 8 is reflected by the reference pattern 2a and returned to the reflectometer as reflection light 8R. The measured reflectivity is regarded as the reflectivity Rref of the reference pattern 2a.

Figure 2G:
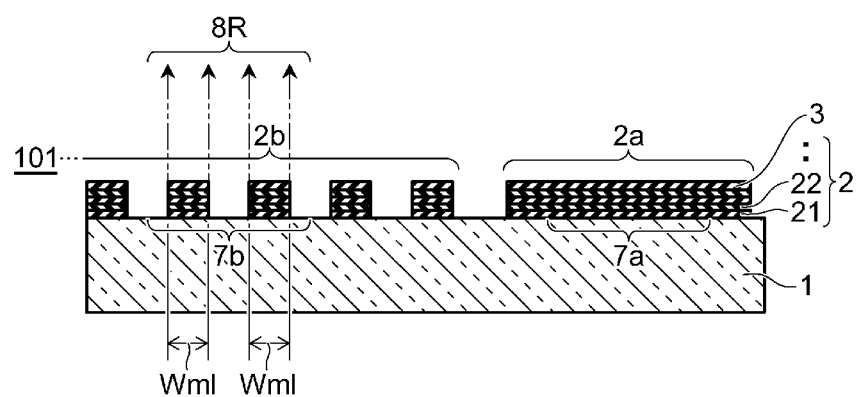

Similarly, as illustrated in FIG. 2F, the measurement spot 7b on the reflection pattern 2b is irradiated with EUV light 8. As illustrated in FIG. 2G, EUV light 8 is reflected by the reflection pattern 2b and returned to the reflectometer as reflection light 8R. The measured reflectivity is regarded as the reflectivity RLS of the reflection pattern 2b.

5. Optical Simulation

As illustrated in Step ST5 in FIG. 1, optical simulation is performed.

Figure 4:
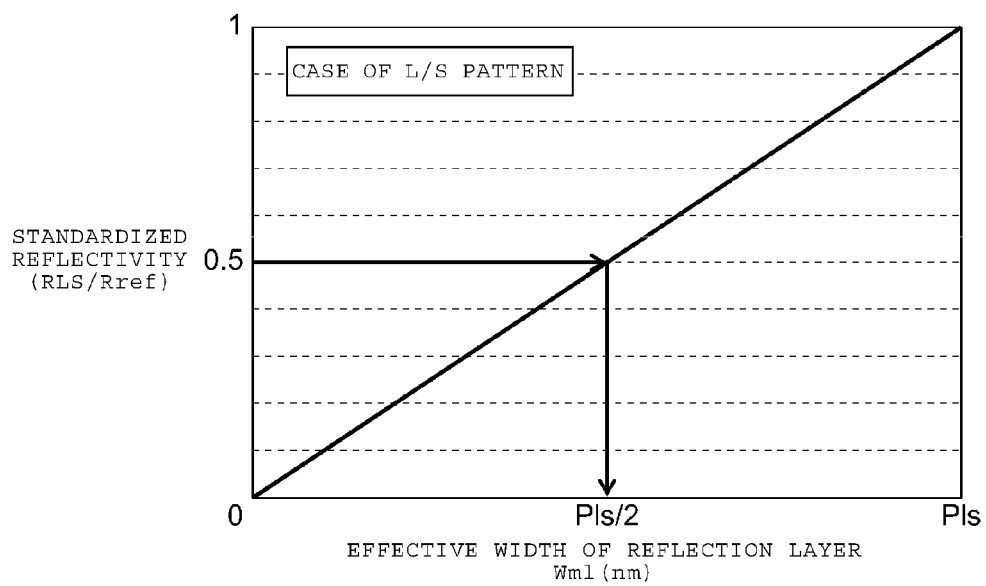
FIG. 4 is a diagram illustrating a relationship between an effective width of a reflection layer and a standardized reflectivity.
Figure 5:
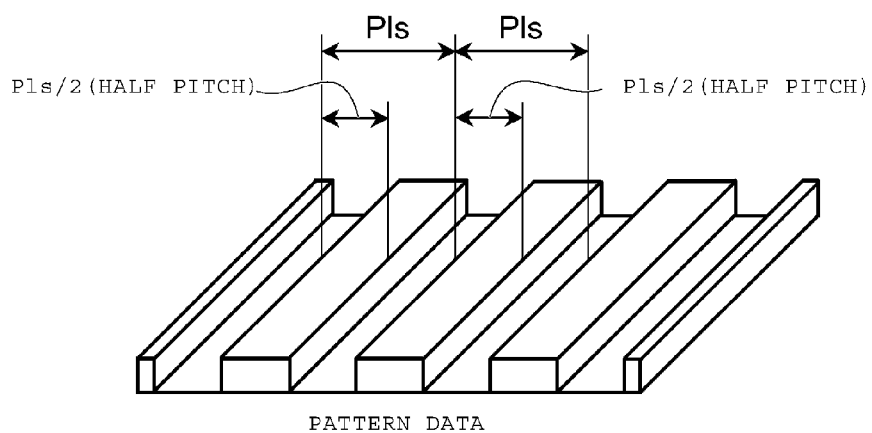
FIG. 5 is a schematic perspective view of visualized pattern data.

FIG. 4 is a diagram illustrating a relationship between an effective width Wml of a reflection layer and a standardized reflectivity RLS/Rref. FIG. 5 is a schematic perspective view of visualized pattern data.

In FIG. 4, a relationship for an L/S pattern is illustrated. When the reflection pattern 2b is a periodic pattern like the L/S pattern as illustrated in FIG. 2G, diffraction light (±first order light) is generated at a site which is separated from an angle of the principal ray by a fixed value depending on a pattern pitch. A collection angle with which the reflectometer is able to collect light is determined by optical design of the reflectometer. The reflectivity RLS of the reflection pattern 2b detected by the reflectometer can be represented in the following Equation (1) as a function of a pitch of the L/S pattern.

$$RLS = f(Pls, Wml) \tag{1}$$

In Equation (1), Pls is a pitch of an L/S pattern of the pattern data and the Wml is an effective width of the reflection layer 2. In FIG. 5, the pitch Pls on the pattern data is visualized and illustrated. In FIG. 5, an L/S pattern of a half pitch (Pls/2) is illustrated. The effective width Wml of the reflection layer 2 is illustrated in FIG. 2G, for example.

For example, when a diffraction angle of diffracted light is sufficiently smaller than the collection angle of the reflectometer, the effective width Wml of the reflection layer may be obtained by using the following Equation (2).

$$Wml=(RLS/Rref)\times Pls \quad (2)$$

As illustrated in FIG. 4, the standardized reflectivity is indicated by "RLS/Rref".

When the reflectivity of the reflection pattern 2b is "0 (no reflection of light)", the effective width of the reflection layer 2 is, for example, "0" by Equation (2). In this case, the reflection layer 2 does not reflect, or simply does not exist, at any point in the pitch Pls.

When the reflectivity of the reflection pattern 2b is RLS=Rref, the effective width of the reflection layer 2 is equal to Pls by Equation (2). In this case, the reflection layer 2 exists in the entire pitch Pls.

When the reflectivity of the reflection pattern 2b is RLS=Rref/2, the effective width of the reflection layer 2 is Pls/2 by Equation (2). In this case, the reflection layer 2 of a half pitch exists in the pitch Pls.

As described above, in the embodiment, the effective width Wml of the reflection layer 2 is predicted and obtained by optical simulation based on the relationship between the effective width Wml of the reflection layer 2 and the standardized reflectivity RLS/Rref. The effective width Wml of the reflection layer 2 predicted by the optical simulation is approximately equal to a width of the reflection layer 2 as measured by a critical dimension-scanning electron microscope (CD-SEM).

6. Determination of Dimensions

As illustrated in Step ST6 in FIG. 1, dimensions of the reflection pattern 2b are measured. In Step 6, it is determined whether the effective width of the reflection layer 2 of the reflection pattern 2b predicted in Step ST5 falls within an allowable range around a design width. When the effective width of the reflection layer 2 does not fall within the allowable range of design (NG), the determination process returns to, for example, Step 1A, and the lithography mask is remanufactured, for example. When the effective width of the reflection layer 2 falls within the allowable range around the design width (OK), the lithography mask is forwarded to the next stage of processing.

In the embodiment, a determination result in Step 6 is used for feedforward control at Step ST2 for manufacture of subsequent lithography masks. When the produced lithography mask is "OK", a subsequent lithography mask is produced, for example, without changing a processing condition in Step ST2. On the contrary, when the lithography mask produced is "NG", for example, the processing condition in Step ST2 is changed according to deviation of the effective width from the design range and a subsequent lithography mask is produced.

Figure 6:
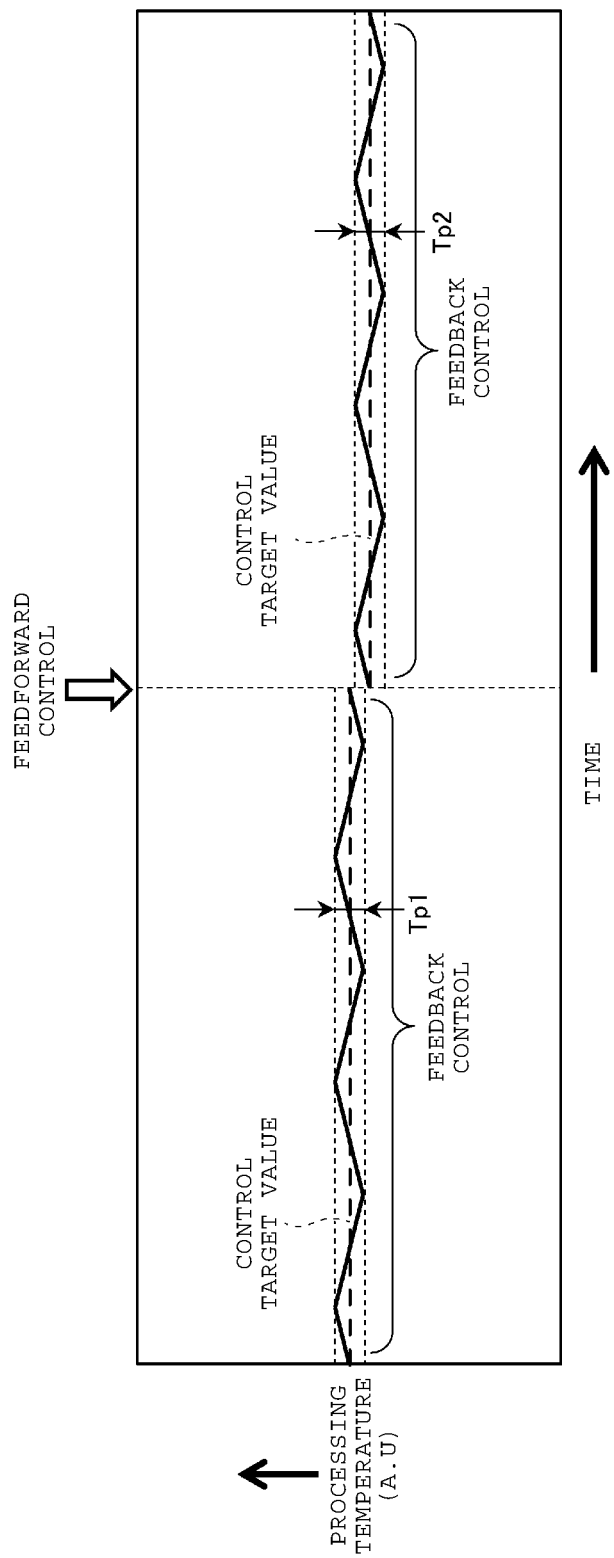
FIG. 6 is a schematic diagram illustrating an example of feedforward control.

FIG. 6 is a schematic diagram illustrating an example of feedforward control. In FIG. 6, an example of processing temperature control when the resist pattern is formed is illustrated, as an example of the feedforward control.

As illustrated in FIG. 6, the processing temperature is subjected to feedback control in, for example, an exposure and development device so as to fall within a processing temperature range Tp1, which is an allowable range, for example, centering on a control target value (control target temperature).

When an "NG" result is obtained in production of a lithography mask, for example, the exposure and development device is subjected to feedforward control such that for example, the processing temperature range Tp1 is changed to a processing temperature band Tp2, for example by changing the control target value for the processing temperature. In FIG. 6, an example in which the processing temperature range Tp1 is lowered to the processing temperature range Tp2 is illustrated. The exposure and development device subjected to feedforward control then performs feedback control such that the processing temperature remains in the processing temperature range Tp2 instead of the processing temperature Tp1.

The feedforward control described above corrects for production of a lithography mask that is outside a tolerance range by adjusting production of subsequent masks. Such measures reduce manufacturing cost by reducing the number of non-conforming masks produced.

In the embodiment, although the determination result in Step ST6 is used for feedforward control at Step ST2 for production of subsequent lithography masks, the determination result may be used for feedforward control at Step ST3 and both of Step ST2 and Step ST3.

Other examples of processing conditions that may be changed subject to feedforward control include exposure time, exposure dose amount, development time, and concentration of a developing solution. When the determination result is used at Step ST3, for example, an etching temperature, an etching time, a concentration of etching gas, or the like may be changed.

Production System

Figure 7:
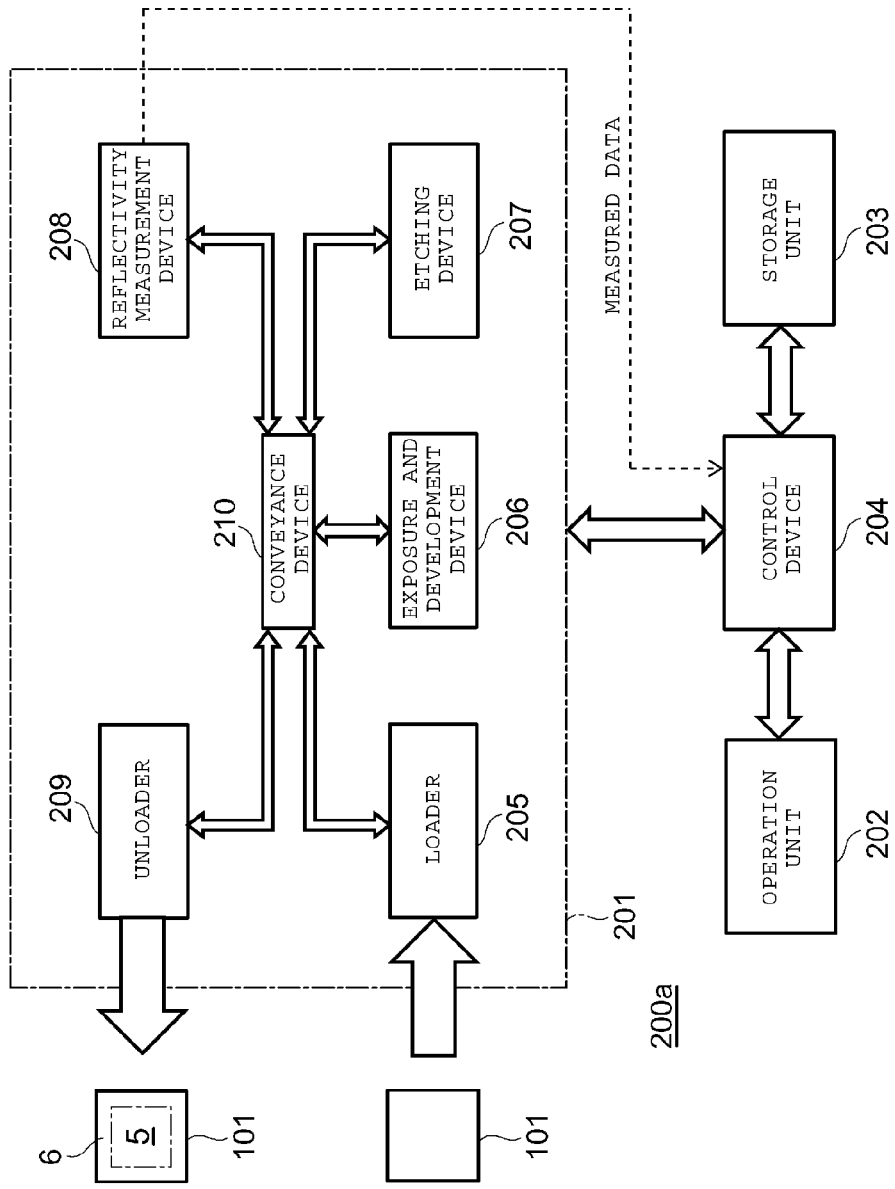
FIG. 7 is a schematic block diagram illustrating a first example of a lithography mask production system.

FIG. 7 is a schematic block diagram illustrating a first example of a lithography mask production system.

As illustrated in FIG. 7, a lithography mask production system 200a includes a processing unit 201, an operation unit 202, a storage unit 203, and a control device 204.

The processing unit 201 processes the blank substrate 100 and produces the lithography mask 101. The lithography mask 101 is obtained from, for example, the completion of optical simulation illustrated in FIG. 2D to FIG. 2G. The processing unit 201 includes, for example, a loader 205, an exposure and development device 206, an etching device 207, a reflectivity measurement device (reflectometer) 208, an unloader 209, and a conveyance device 210.

The operation unit 202 includes, for example, a touch panel with which an operator performs an input manipulation or the like in order to manage the production system 200a, a display which visualizes and displays an operation state, or the like.

In the storage unit 203, for example, the pattern data to be formed on the blank substrate 100, a control recipe used for processing substrates, or the like is stored.

The control device 204 includes, for example, a microprocessor. The control device 204 reads the control recipe and the pattern data from the storage unit 203 based on an instruction from the operation unit 202. The control device 204 controls the processing unit 201 according to the control recipe. The processing unit 201 forms the reference pattern 2a and the reflection pattern 2b on the blank substrate 100 according to the instruction of the control device 204 based on the lithography mask production method of the first embodiment.

The production system 200a produces, for example, the lithography mask 101 from the blank substrate 100 as follows.

The blank substrate 100 illustrated in FIG. 2A and FIG. 3A is carried into the loader 205 using an external conveyance device (not illustrated).

The blank substrate 100 carried into the loader 205 is carried out from the loader 205 and is carried into the exposure and development device 206 by the conveyance device 210.

The exposure and development device 206 exposes and develops the resist layer 4 according to Step ST2. For example, electron beam may be used for exposure in the exposure and development device 206. In this way, the resist patterns 4a and 4b illustrated in FIG. 2B and FIG. 3B can be formed on the blank substrate 100.

The blank substrate 100 on which the resist patterns 4a and 4b are formed is carried out from the exposure and development device 206 and is carried into the etching device 207 by the conveyance device 210.

The etching device 207 etches the reflection layer 2 according to Step ST3 to form the reference pattern 2a and the reflection pattern 2b illustrated in FIG. 2C and FIG. 3C on the blank substrate 100, thus completing the lithography mask 101.

The lithography mask 101 is carried out from the etching device 207 and is carried into the reflectivity measurement device 208 by the conveyance device 210.

The reflectivity measurement device 208 measures the reflectivity Rref of the reference pattern 2a and the reflectivity RLS of the reflection pattern 2b as illustrated in Step ST4, FIG. 2D to FIG. 2G, and FIG. 3D. The measured data is transmitted to, for example, the control device 204.

The control device 204 is equipped with an operation function. The control device 204 performs optical simulation illustrated in Step ST5, FIG. 4 and FIG. 5 based on the transmitted measured data. Thereafter, according to Step ST6, it is determined whether an effective width of the reflection layer 2 included in the reflection pattern 2b falls within an allowable width based on the design. When the determination result is "NG", for example, the control device 204 instructs the exposure and development device 206, the etching device 207, or both to change one or more processing conditions. With this, the determination result in Step ST6 is used in feedforward control of the processing conditions for subsequent lithography masks.

The lithography mask 101 for which a reflectivity measurement has been finished is carried out from the reflectivity measurement device 208 and is carried into the unloader 209 by the conveyance device 210. The lithography mask 101 carried into the unloader 209 is carried out from the unloader 209 to the outside of the processing unit 201 using an external conveyance device (not illustrated).

The lithography mask production method according to the first embodiment can be executed by a production system as illustrated in FIG. 7, for example.

According to the first embodiment, a lithography mask production method and a lithography mask production system capable of measuring the effective width of the reflection layer 2 included in the reflection pattern 2b of the lithography mask 101, for example, by using a reflectometer. In such cases, a high cost EUV microscope is not needed to evaluate the pattern in the lithography mask.

Second Embodiment

Production Method

Figure 8:
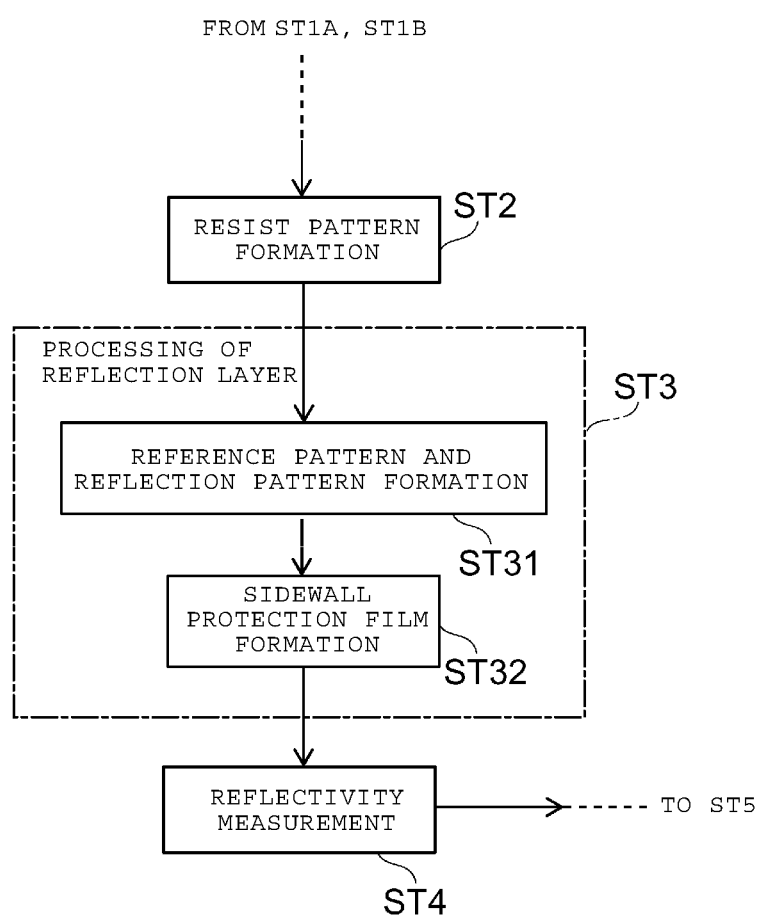
FIG. 8 is a flowchart illustrating an example of a lithography mask production method according to a second embodiment.

FIG. 8 is a flowchart illustrating an example of a lithography mask production method according to a second embodiment. FIG. 9A to FIG. 9D are schematic sectional views illustrating an example of a lithography mask production method according to the second embodiment.

As illustrated in FIG. 8, a difference between the second embodiment and the first embodiment is the reflection layer processing of Step ST3. In the second embodiment, a side wall protection film 9 is formed on side walls of a reflection layer 2 included in a reference pattern 2a and side walls of the reflection layer 2 included in a reflection pattern 2b.

Figure 9A:
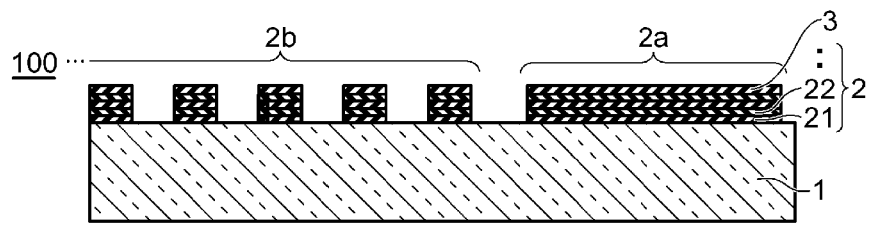
FIG. 9A to FIG. 9D are schematic sectional views illustrating an example of the lithography mask production method according to the second embodiment.

As illustrated in Step ST31 in FIG. 8 and FIG. 9A, the reflection layer 2 is etched and the reference pattern 2a and the reflection pattern 2b are formed on a blank substrate 100. The process indicated in Step 31 is the same as the process of Step ST3 indicated in FIG. 1.

Figure 9B:
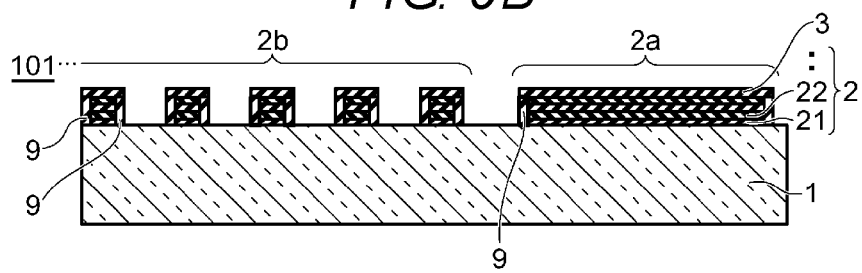

Next, as illustrated in Step ST32 in FIG. 8 and FIG. 9B, the side wall protection film 9 is formed on the side walls of the reflection layer 2 included in the reference pattern 2a and the side walls of the reflection layer 2 included in the reflection pattern 2b, thus completing the lithography mask 101.

Figure 9C:
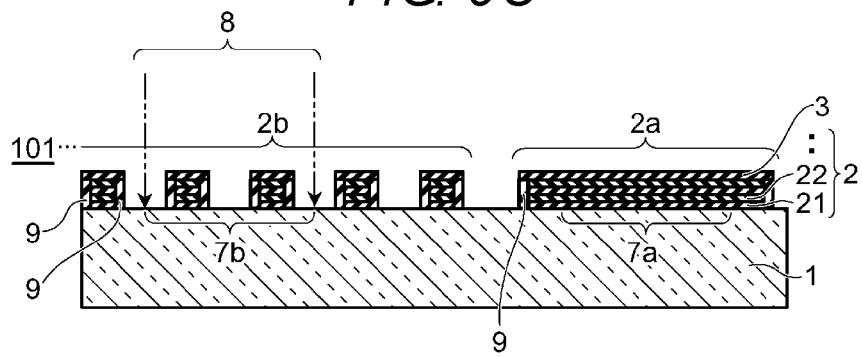
Figure 9D:
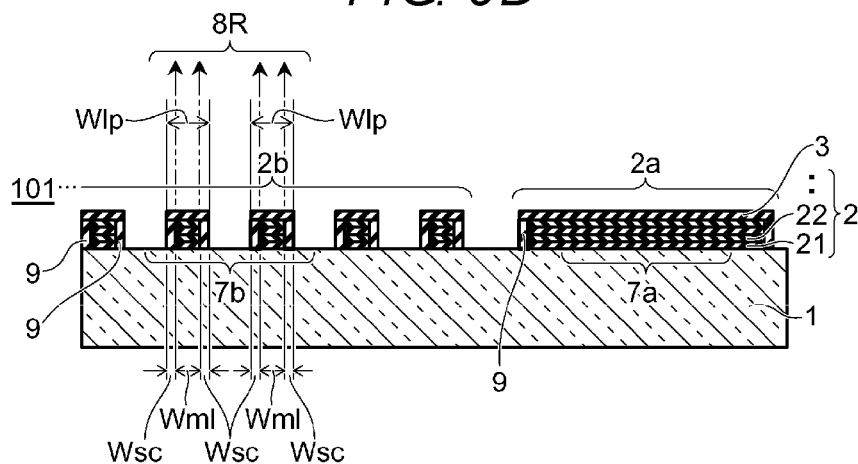

Next, as illustrated in Step ST4 in FIG. 8 and FIG. 9C and FIG. 9D, similarly to Step ST4 indicated in FIG. 1, the reflectivity Rref of the reference pattern 2a and the reflectivity RLS of the reflection pattern 2b are measured using the reflectometer. Thereafter, although not illustrated, optical simulation is performed similarly to Step ST5 of in FIG. 1.

In the second embodiment, the reflectivity RLS of the reflection pattern 2b detected by the reflectometer is represented by the following Equation (3), for example, as a function of pitch of an L/S pattern and a width of the side wall protection film 9 are included in variables.

$$RLS = f(Pls, Wml, Wsc) \quad (3)$$

In Equation (3), Pls is the pitch of the L/S pattern, Wml is the effective width of the reflection layer 2, and Wsc is the width of the side wall protection film 9. The width Wsc of the side wall protection film 9 is illustrated in FIG. 9D.

A width Wlp of the reflection layer 2 measured by CD-SEM is obtained by the following Equation (4).

$$Wlp = Wml + Wsc \times 2 \quad (4)$$

As illustrated in Equation (4), the CD-SEM measures a width of the reflection layer 2 with including the side wall protection film 9.

The side wall protection film 9 might not reflect EUV light 8, and may even absorb some or all the EUV light 8. Therefore, even though the side wall protection film 9 is formed on the side walls of the reflection layer 2, similarly to the first embodiment, the reflectivity RLS may only be affected by the effective width Wml of the reflection layer 2.

Dose focus margin of dimensions of a resist actually formed on a wafer is measured using the lithography mask 101 produced according to the second embodiment after an EUV light lithography process is performed. As a result, the width Wml of the reflection layer 2 obtained based on the reflectivity measured by the reflectometer is more consistent with the lithography simulation result than the width Wlp of the reflection layer 2 measured by the CD-SEM.

When the lithography mask 101 produced according to the second embodiment is used for an EUV lithography process of the wafer, the EUV lithography process has high reliability and high quality. When the reliability and quality of the EUV lithography process are improved, production yield of the semiconductor device produced using the EUV lithography process is enhanced, for example.

According to the second embodiment, even when the side walls of the reflection layer 2 are coated with the side wall protection film 9, the effective width Wml of the reflection layer 2 excluding the side wall protection film 9 can be measured.

Production System

Figure 10:
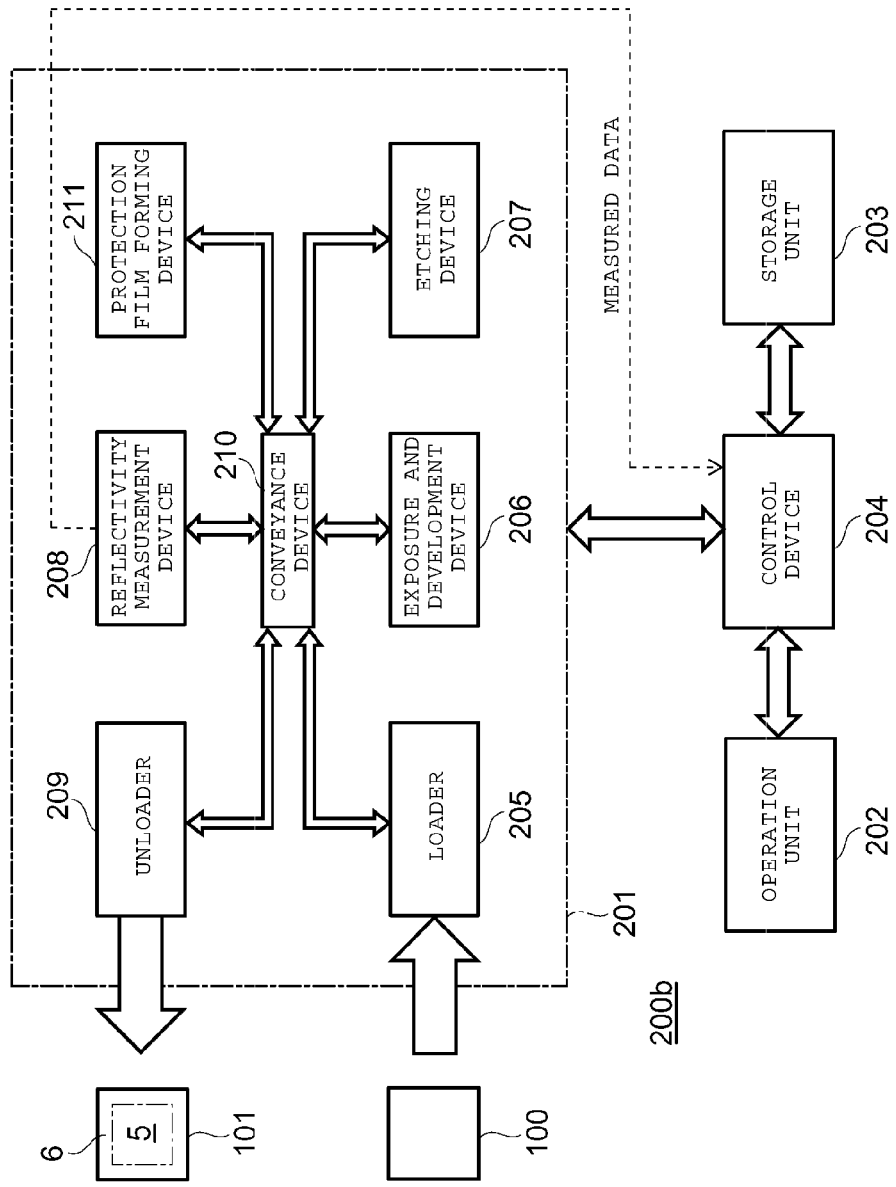
FIG. 10 is a schematic block diagram illustrating a second example of the lithography mask production system.

FIG. 10 is a schematic block diagram illustrating a second example of a lithography mask production system.

As illustrated in FIG. 10, a production system 200b of the second example differs from the production system 200a of the first example illustrated in FIG. 7 in that a processing unit 201 includes a protection film forming device 211.

For example, a conveyance device 210 carries out the blank substrate 100 for which etching of the reflection layer 2 has been finished from an etching device 207 and carries the blank substrate 100 into a protection film forming device 211.

The protection film forming device 211 forms the side wall protection film 9 on the side walls of the reflection layer 2. The protection film forming device 211 may be, for example, a thermal processing device or a film deposition device such as a CVD device. The protection film forming device 211 may be a device capable of forming the side wall protection film 9 on the side walls of the reflection layer 2. The side wall protection film 9 is formed on the side walls of the reflection layer 2, and thus the lithography mask 101 according to the second embodiment is completed.

The completed lithography mask 101 is carried out from the protection film forming device 211 and is carried into a reflectivity measurement device 208 by the conveyance device 210. Thereafter, the optical simulation and the dimension determination described in the first embodiment are performed. Also, in the second embodiment, similarly to the first embodiment, no EUV microscope is needed to measure the effective width of the reflection layer 2 included in the reflection pattern 2b.

The lithography mask production method according to the second embodiment can be executed, for example, by the production system illustrated in FIG. 10.

According to the second embodiment, the lithography mask production method and the lithography mask production system, which are capable of measuring the effective width Wml of the reflection layer 2 even when the side walls of the reflection layer 2 are coated with the side wall protection film 9, can be provided.

Third Embodiment

Production Method

Figure 11:
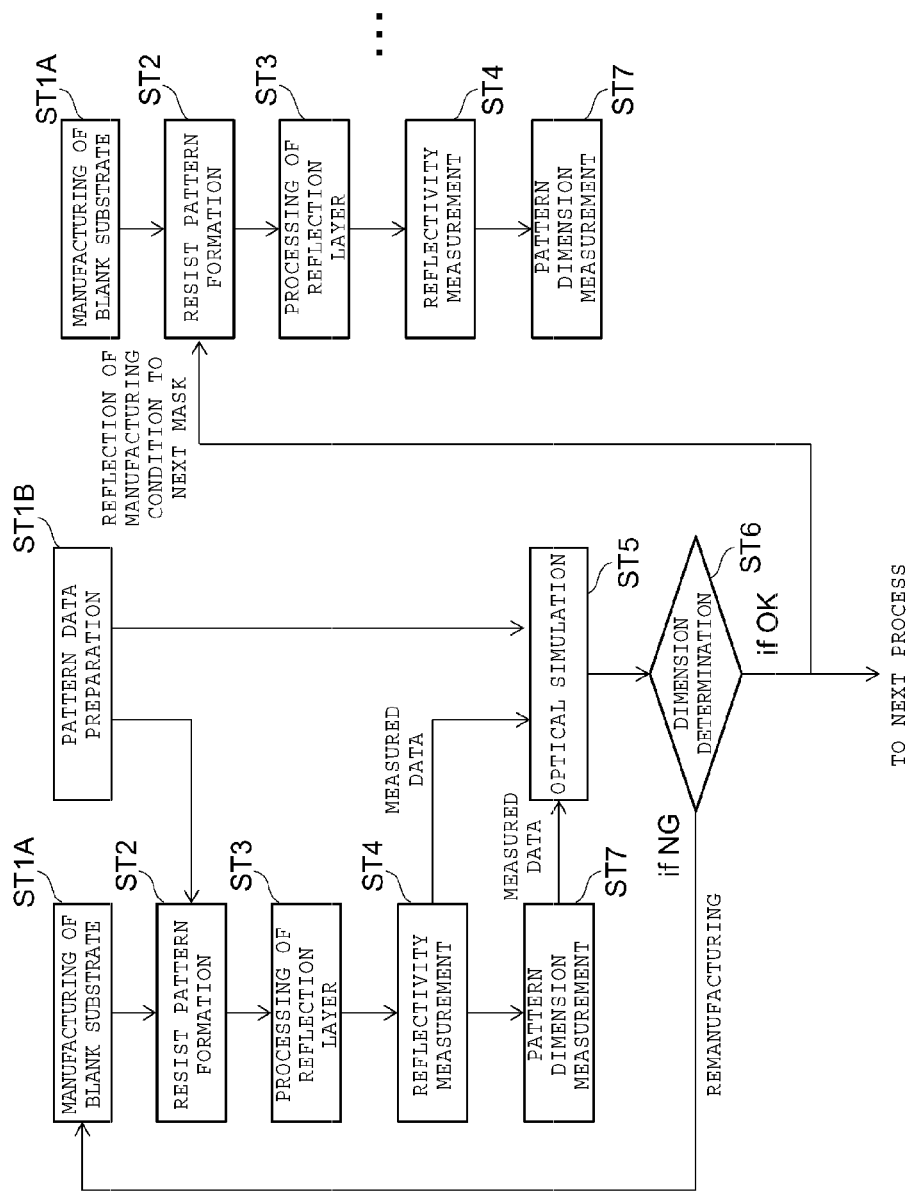
FIG. 11 is a flowchart illustrating an example of a lithography mask production method according to a third embodiment.
Figure 12:
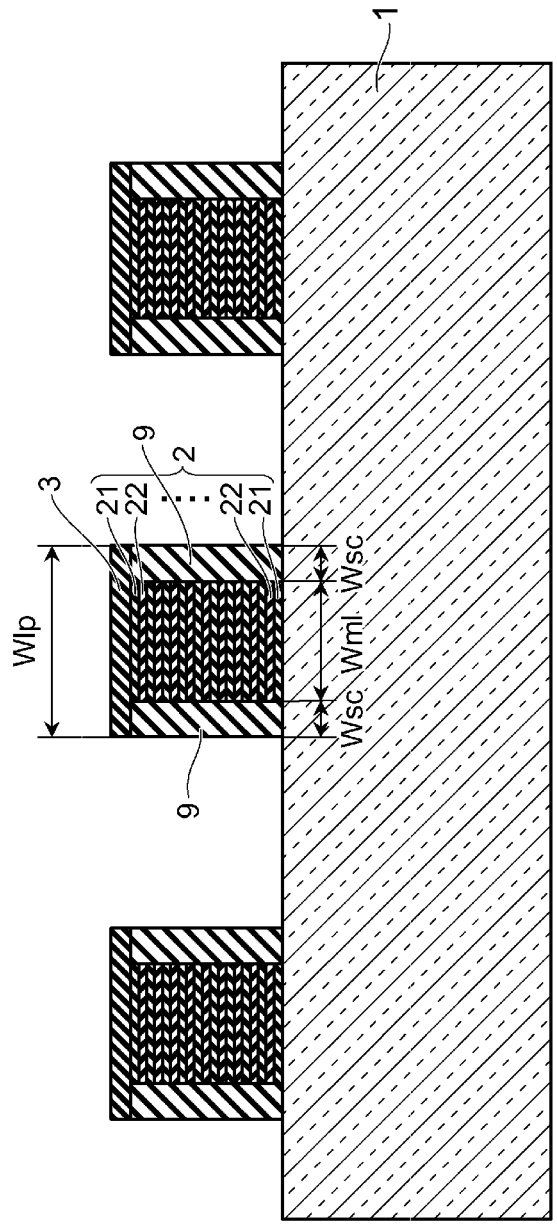
FIG. 12 is a schematic sectional view illustrating respective sizes of portions of a reflection pattern.

FIG. 11 is a flowchart illustrating an example of a lithography mask production method according to a third embodiment. FIG. 12 is a schematic sectional view illustrating respective sizes of portions of a reflection pattern.

As illustrated in FIG. 11, the third embodiment includes Step ST7, which is a difference from the first embodiment and the second embodiment. In Step ST7, pattern dimensions are measured. The pattern dimensions are a width Wlp of a reflection layer 2 included in a reflection pattern 2b. When a side wall protection film 9 is provided on the side walls of the reflection layer 2, the width Wlp of the reflection layer 2 is measured to include a width Wsc of the side wall protection film 9 as illustrated in FIG. 12, for example. Measurement is performed using a CD-SEM, for example.

In the third embodiment, the width Wlp of the reflection layer 2 is measured. As represented by Equation (4), when the side wall protection film 9 is provided, the width Wlp of the reflection layer 2 is obtained as an equation "Wlp=Wml+Wsc×2". When Equation (4) is modified, the width Wsc of the side wall protection film 9 can be obtained as represented in Equation (5).

$$Wsc=(Wlp-Wml)/2 \tag{5}$$

It is difficult to obtain the width Wsc of the side wall protection film 9 when using solely, for example, the CD-SEM. However, as in the third embodiment, when the effective width Wml of the reflection layer 2 and the width Wlp of the reflection layer 2 are measured, the width Wsc of the side wall protection film 9 can be obtained based on Equation (5).

According to the third embodiment, similarly to the first embodiment and the second embodiment, the effective width Wml of the reflection layer 2 is obtained using the reflectometer and further, in the third embodiment, the width Wlp of the reflection layer 2 is obtained using the CD-SEM, for example. In this way, the width Wsc of the side wall protection film 9, which is difficult to obtain when using only, for example, the CD-SEM, can be obtained.

Production System

FIG. 13 is a schematic block diagram illustrating a third example of a lithography mask production system.

As illustrated in FIG. 13, a production system 200c of the third example differs from the production system 200b of the second example illustrated in FIG. 10 in that a processing unit 201 includes a CD-SEM 212.

For example, a conveyance device 210 removes a lithography mask 101, for which the measurement of the reflectivity has been finished, from a reflectivity measurement device 208 and carries the lithography mask 101 into the CD-SEM 212.

As indicated in Step ST7 in FIG. 11, the CD-SEM 212 measures the width Wlp of the reflection layer 2 included in the reflection pattern 2b to include, for example, the width of the side wall protection film 9. Measured data is transmitted to the control device 204, for example.

The control device 204 performs optical simulation indicated in Step ST5 based on the measured data transmitted from the reflectivity measurement device 208 and the CD-SEM 212. In the optical simulation of the third embodiment, the control device 204 obtains the effective width Wml of the reflection layer 2 by optical simulation and the width Wlp of the reflection layer 2 from the CD-SEM data. Furthermore, the width Wsc of the side wall protection film 9 is obtained, for example, based on Equation (5).

The lithography mask 101 for which measurement of the width Wlp of the reflection layer 2 has been finished is removed from the reflectivity measurement device 208 and is carried into an unloader 209 by the conveyance device 210. The lithography mask 101 carried into the unloader 209 is removed from the unloader 209 to the outside of the processing unit 201 using an external conveyance device (not illustrated).

The lithography mask production method according to the third embodiment can be executed by the production system illustrated in FIG. 13, for example.

As described above, according to the third embodiment, the lithography mask production method and the lithography mask production system, which are capable of obtaining the width Wsc of the side wall protection film 9 provided on the side walls of the reflection layer 2, can be provided.

Fourth Embodiment

Reflectivity Measurement

FIG. 14 is a schematic sectional view illustrating an example of a reflectivity measurement of a fourth embodiment.

In the first embodiment to the third embodiment, the reference pattern 2a and the reflection pattern 2b are vertically irradiated with measurement light 8 and the reflectivity of the reference pattern 2a and the reflectivity of the reflection pattern 2b are measured. An irradiation direction of the measurement light 8 with respect to the reference pattern 2a and the reflection pattern 2b is not, however, limited to a vertical direction.

For example, as illustrated in FIG. 14, a reference pattern 2a and a reflection pattern 2b are obliquely irradiated with measurement light 8. The reflectivity of the reference pattern 2a and the reflectivity of the reflection pattern 2b can also be measured from reflection light 8R of the measurement light 8 used for the oblique irradiation.

For example, in an EUV lithography process, the reflection pattern 2b is irradiated with EUV light at a predetermined angle. An example of the predetermined angle is 6°. Accordingly, for example, the reference pattern 2a and the reflection pattern 2b may be irradiated with the measurement light 8 which is EUV at an exemplary angle of 6°. An oblique angle is not limited to 6°, and may be an angle of greater than 0° (perpendicularity) and less than 6° or equal to or greater than 6° and less than 180° (horizontality).

Furthermore, the reflectivity of the reference pattern 2a and the reflectivity of the reflection pattern 2b may be measured using both the reflectivity obtained when the reference pattern 2a and the reflection pattern 2b are vertically irradiated with the measurement light 8 and the reflectivity obtained when the reference pattern 2a and the reflection pattern 2b are obliquely irradiated with the measurement light 8.

In this case, for example, the reflectivity is obtained for each of a plurality of angles of the measurement light 8 and a plurality measured reflectivities are used to improve measurement accuracy of the effective width Wml of the reflection layer 2.

Regarding the reflectivity obtained when the reference pattern 2a and the reflection pattern 2b are obliquely irradiated with the measurement light 8, the oblique angle is not limited to a single angle. The reflectivity may be measured in such a way that a plurality of different angles are used and a plurality of the reflectivities obtained using different irradiation angles in addition to vertical irradiation reflectivity. The reflectivity of a plurality of angles is thus considered, leading to improved measurement accuracy of the effective width Wml of the reflection layer 2.

According to the fourth embodiment, the effective width Wml of the reflection layer 2 included in the reflection pattern 2b can be measured more accurately.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A lithography mask production method comprising:
   (a) forming, in a reflection layer of a blank substrate, a reference pattern used as a reference in reflectivity measurement and a reflection pattern used for lithography;
   (b) measuring a reflectivity Rref of the reflection layer at the reference pattern and a reflectivity RLS of the reflection layer at the reflection pattern; and
   (c) determining an effective width of the reflection layer at the reflection pattern based on the reflectivity Rref and the reflectivity RLS.

2. The method according to claim 1, further comprising:
   (d) forming a side wall protection film at least on side walls of the reflection layer at the reflection pattern between the (a) forming and the (b) measuring,
   wherein the effective width of the reflection layer obtained in the (b) measuring and the (c) determining does not include a width of the side wall protection film.

3. The method according to claim 2,
   wherein the reference pattern and the reflection pattern are formed in the reflection layer based on pattern data prepared in advance,
   wherein a width Wml of the reflection layer at the reflection pattern is obtained based on the following equation, $$Wml = (RLS/Rref) \times Pls \qquad (2)$$

where Pls is a pitch of the pattern data, and
   wherein in the measuring (b), a width Wlp of the reflection layer including the side wall protection film is measured and a width Wsc of the side wall protection film is obtained based on of the following relationship, $$Wsc = (Wlp - Wml)/2.$$

4. The method according to claim 1,
   wherein the reference pattern and the reflection pattern are formed on the reflection layer based on pattern data prepared in advance, and
   wherein a width Wml of the reflection layer at the reflection pattern is obtained based on the following equation, $$Wml = (RLS/Rref) \times Pls \qquad (2)$$

where Pls is a pitch of the pattern data.

5. The method according to claim 1, further comprising:
   (d) determining, after the measuring (b), whether the effective width of the reflection layer obtained in the measuring (b) falls within an allowable range,
   wherein the determination result in (d) is used for feedforward control in production of subsequent lithography masks.

6. The method according to claim 1,
   wherein the reflectivity Rref is measured at first measurement spot on the reference pattern,
   wherein the reflectivity RLS is measured at a second measurement spot on the reflection pattern, and
   wherein a plane size of the first measurement spot and a plane size of the second measurement spot are smaller than a plane size of the reference pattern and a plane size of the reflection pattern, respectively.

7. The method according to claim 6,
   wherein a size of the first measurement spot is equal to a size of the second measurement spot.

8. A lithography mask production method comprising:
   (a) forming, in a reflection layer of a blank substrate, a reference pattern used as a reference in reflectivity measurement and a reflection pattern used for lithography; and
   (b) measuring a reflectivity Rref of the reflection layer included in the reference pattern and a reflectivity RLS of the reflection layer included in the reflection pattern;
   (c) determining an effective width of the reflection layer included in the reflection pattern based on the reflectivity Rref and the reflectivity RLS;
   (d) determining whether the effective width falls within an allowable range; and (e) adjusting a processing condition in forming the reference pattern and the reflection pattern according to whether or not the effective width falls outside the allowable range.

9. The method according to claim 8, further comprising:

(f) forming a side wall protection film at least on side walls of the reflection layer at the reflection pattern between the (a) forming and the (b) measuring, wherein the effective width of the reflection layer obtained in the (b) measuring and the (c) determining does not include a width of the side wall protection film.

10. The method according to claim 8, wherein the reflectivity Rref is measured at first measurement spot on the reference pattern, wherein the reflectivity RLS is measured at a second measurement spot on the reflection pattern, and wherein a plane size of the first measurement spot and a plane size of the second measurement spot are smaller than a plane size of the reference pattern and a plane size of the reflection pattern, respectively.

11. The method according to claim 10, wherein a size of the first measurement spot is equal to a size of the second measurement spot.

* * * * *